US012628369B2

(12) United States Patent
Meng et al.

(10) Patent No.: US 12,628,369 B2
(45) Date of Patent: May 12, 2026

(54) NITRIDE-BASED SEMICONDUCTOR DEVICE WITH GATE PROTECTION LAYER AND METHOD FOR MANUFACTURING THE SAME

(71) Applicant: INNOSCIENCE (SUZHOU) TECHNOLOGY CO., LTD., Suzhou City (CN)

(72) Inventors: Liuchang Meng, Suzhou City (CN); Hung-Yu Chen, Suzhou City (CN); Kaiming Fan, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 1216 days.

(21) Appl. No.: 17/426,658

(22) PCT Filed: Jun. 11, 2021

(86) PCT No.: PCT/CN2021/099767
§ 371 (c)(1),
(2) Date: Jul. 29, 2021

(87) PCT Pub. No.: WO2022/257122
PCT Pub. Date: Dec. 15, 2022

(65) Prior Publication Data
US 2025/0048668 A1 Feb. 6, 2025

(51) Int. Cl.
*H10D 30/47* (2025.01)
*H01L 23/31* (2006.01)
(Continued)

(52) U.S. Cl.
CPC ....... *H10D 30/475* (2025.01); *H01L 23/3171* (2013.01); *H10D 30/015* (2025.01); *H10D 62/8503* (2025.01); *H10D 64/111* (2025.01)

(58) Field of Classification Search
CPC ............... H10D 30/475; H10D 30/015; H10D 62/8503; H10D 64/111; H01L 23/3171
See application file for complete search history.

(56) References Cited

U.S. PATENT DOCUMENTS

| | | | |
|---|---|---|---|
| 2014/0239306 A1 | 8/2014 | Liu et al. | |
| 2015/0357422 A1* | 12/2015 | Liao ..................... | H10D 64/111 |
| | | | 438/172 |
| 2022/0209001 A1* | 6/2022 | Otake .................. | H10D 30/015 |

FOREIGN PATENT DOCUMENTS

| | | | |
|---|---|---|---|
| CN | 109727863 A | 5/2019 | |
| CN | 112119494 A | 12/2020 | |
| CN | 112614834 A * | 4/2021 | ......... H01L 21/8252 |

OTHER PUBLICATIONS

International Search Report and Written Opinion of the corresponding PCT application No. PCT/CN2021/099767 mailed on Mar. 4, 2022.

* cited by examiner

*Primary Examiner* — Brian Turner
*Assistant Examiner* — Zhijun Xu
(74) *Attorney, Agent, or Firm* — Li & Cai Intellectual Property (USA) Office

(57) ABSTRACT

A nitride-based semiconductor device includes a first and second nitride-based semiconductor layers, two or more source/drain (S/D) electrodes, a gate electrode, a doped III-V semiconductor layer, a gate protection layer and a first passivation layer. The doped III-V semiconductor layer is disposed between the second nitride-based semiconductor layer and the gate electrode. The gate protection layer caps the gate electrode and the doped III-V semiconductor layer and is separated from the S/D electrodes. The first passivation layer covers the second nitride-based semiconductor layer and the gate protection layer and abuts against side- (Continued)

100A 102 103 104 106 110 A 140 120 130 1501 1502 1503 112
150

160 180 190 192 162 174
172
170 walls of the S/D electrodes which are separated from the gate protection layer by the first passivation layer.

20 Claims, 7 Drawing Sheets

(51) Int. Cl.
    *H10D 30/01*        (2025.01)
    *H10D 62/85*        (2025.01)
    *H10D 64/00*        (2025.01)

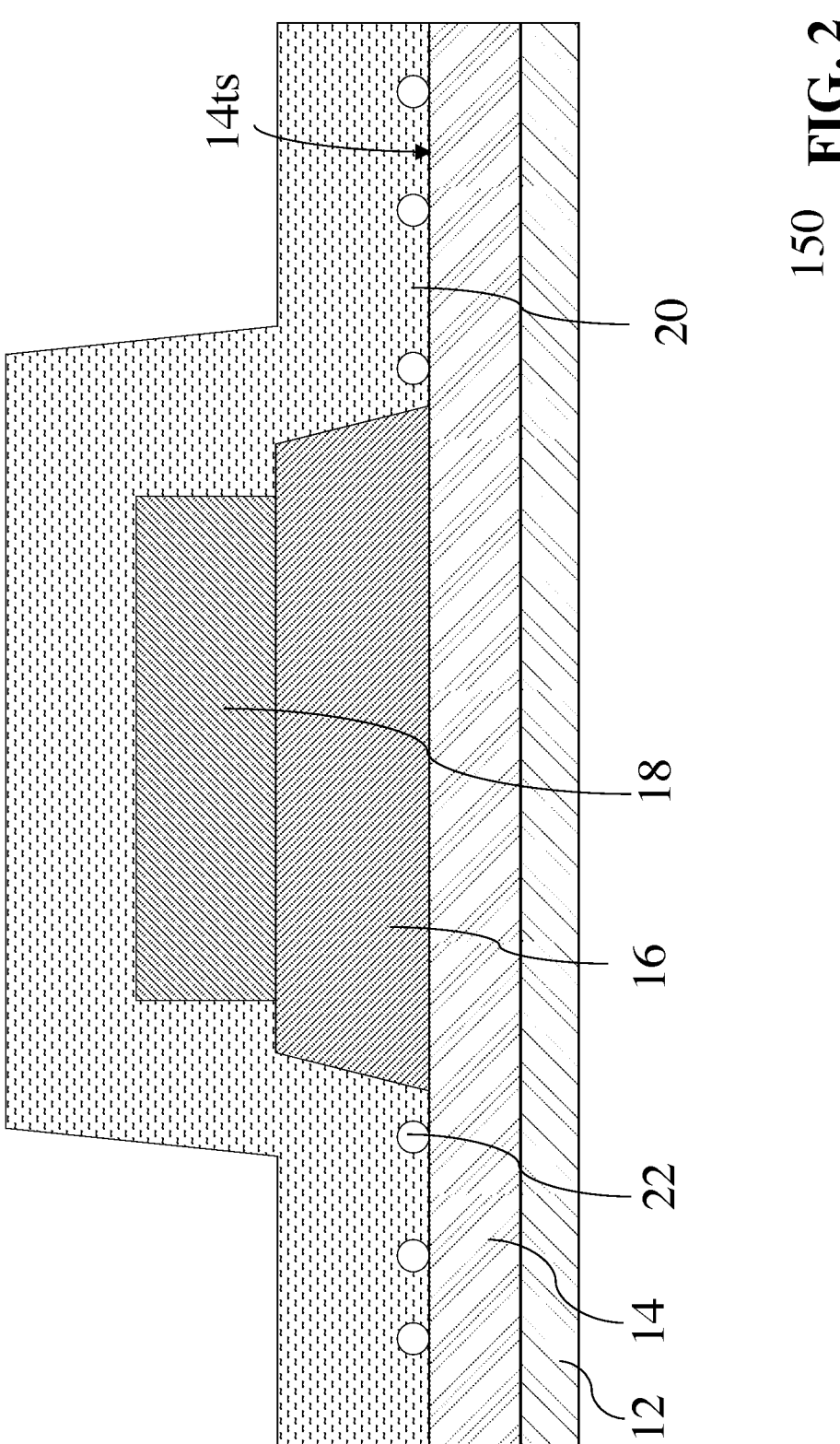
14ts
20
18
16
22
14
12
10
150     FIG. 2

100C

140

150

1

NITRIDE-BASED SEMICONDUCTOR DEVICE WITH GATE PROTECTION LAYER AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having a gate protection layer located between the gate electrode and the passivation layer for improving electrical characteristics of the semiconductor device.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). During manufacturing of III-nitride devices, unwanted processing residue may remain, impairing the quality of the final device. Further, stresses from various passivation layers may negatively impact the semiconductor device. Therefore, improvements in manufacturing techniques and layer structures is needed to improve device yield and performance.

SUMMARY OF THE DISCLOSURE

In accordance with one aspect of the present disclosure, a nitride-based semiconductor device is provided. A nitride-based semiconductor device includes a first nitride-based semiconductor layer, a second nitride-based semiconductor layer, two or more source/drain (S/D) electrodes, a gate electrode, a doped III-V semiconductor layer, a gate protection layer and a first passivation layer. The second nitride-based semiconductor layer is disposed on the first nitride-based semiconductor layer and has a bandgap greater than a bandgap of the first nitride-based semiconductor layer. The S/D electrodes are disposed above the second nitride-based semiconductor layer. The gate electrode is disposed above the second nitride-based semiconductor layer and between the S/D electrodes. The doped III-V semiconductor layer is disposed between the second nitride-based semiconductor layer and the gate electrode. The gate protection layer caps the gate electrode and the doped III-V semiconductor layer and is separated from the S/D electrodes. The first passivation layer covers the second nitride-based semiconductor layer and the gate protection layer and abuts against sidewalls of the S/D electrodes which are separated from the gate protection layer by the first passivation layer. At least one material of the gate protection layer has an intrinsic stress selected to redistribute a stress from the passivation layer.

In accordance with one aspect of the present disclosure, a method for manufacturing a semiconductor device is provided. The method includes steps as follows. A first nitride-based semiconductor layer is formed on a substrate. A second nitride-based semiconductor layer is formed on the first nitride-based semiconductor layer. A gate electrode is formed over the second nitride-based semiconductor layer by depositing a metal element and a group V element. A gate protection layer is formed to cover the gate electrode. An area of the second nitride-based semiconductor layer which is free from the coverage of the gate protection layer is cleaned by using a standard cleaning solution. A passivation layer covering the gate protection layer and the area of the second nitride-based semiconductor layer is formed.

In accordance with one aspect of the present disclosure, a nitride-based semiconductor device is provided. A nitride-based semiconductor device includes a first nitride-based semiconductor layer, a second nitride-based semiconductor layer, a doped III-V semiconductor layer, a gate electrode, a gate protection layer and a passivation layer. The second nitride-based semiconductor layer is disposed on the first nitride-based semiconductor layer and has a bandgap greater than a bandgap of the first nitride-based semiconductor layer. The doped III-V semiconductor layer is disposed above the second nitride-based semiconductor layer. The gate electrode is disposed above the doped III-V semiconductor layer and has an edge spaced apart from an edge of the doped III-V semiconductor layer by a first distance. The gate protection layer covers the gate electrode and the doped III-V semiconductor layer and has an edge separated from the edge of the doped III-V semiconductor layer by a second distance. The second distance is less than the first distance. The passivation layer covers the second nitride-based semiconductor layer and surrounds the gate protection layer.

By applying the above configuration, the gate protection layer can release the thermal stress generated by the passivation layer. The gate protection layer can protect the gate electrode from being damaged by a cleaning solution with high oxidation ability. Hence, the cleaning solution with a high oxidation ability can be selected and applied to the semiconductor device during the manufacturing process, such that the probability of the residue remaining on the surface/sidewall of the nitride-based semiconductor layer can be reduced, thereby improving the performance of the nitride-based semiconductor device.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2 is a vertical cross-sectional view of a semiconductor device according to a comparative embodiment;

DETAILED DESCRIPTION

Figure 1A:
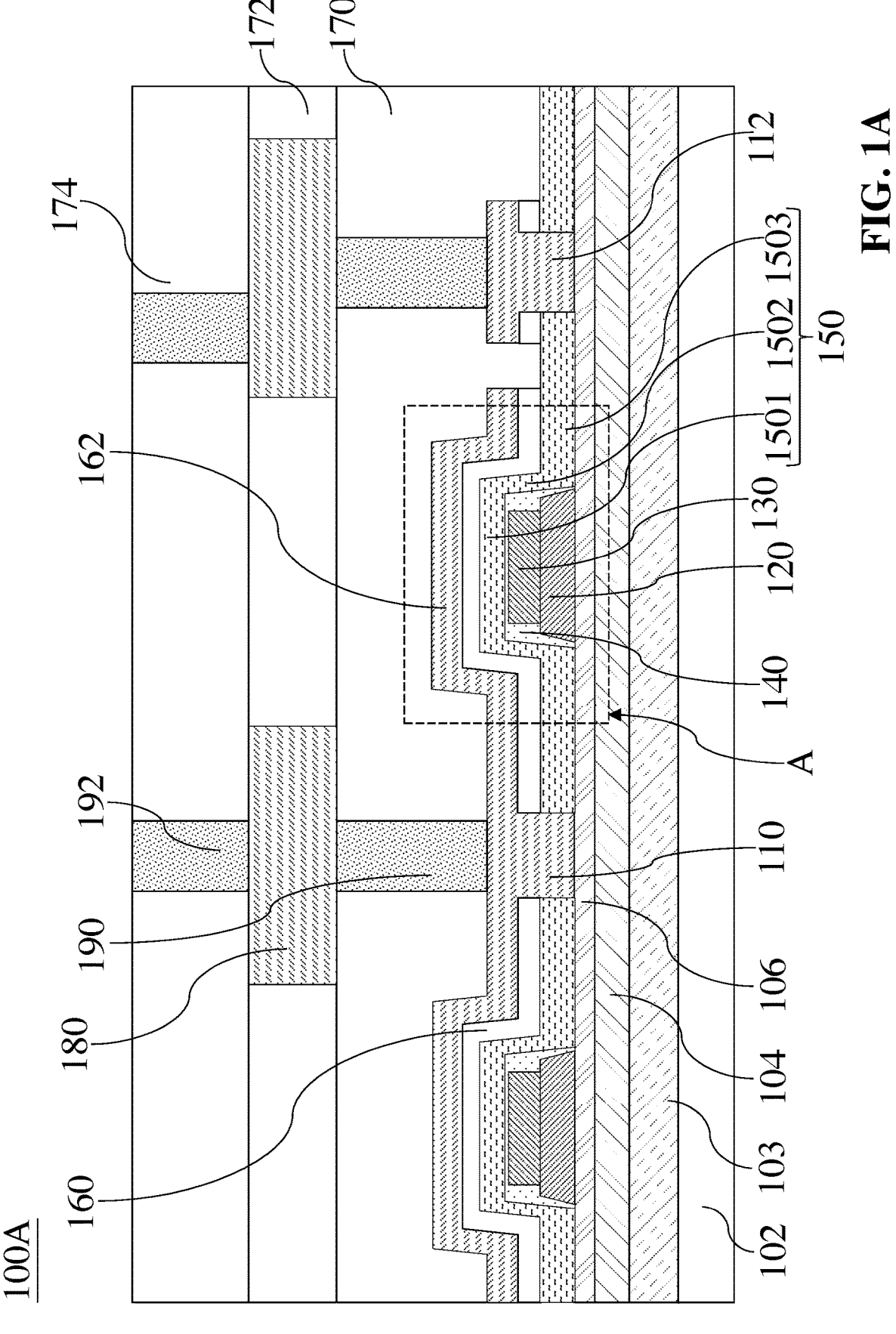
FIG. 1A is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
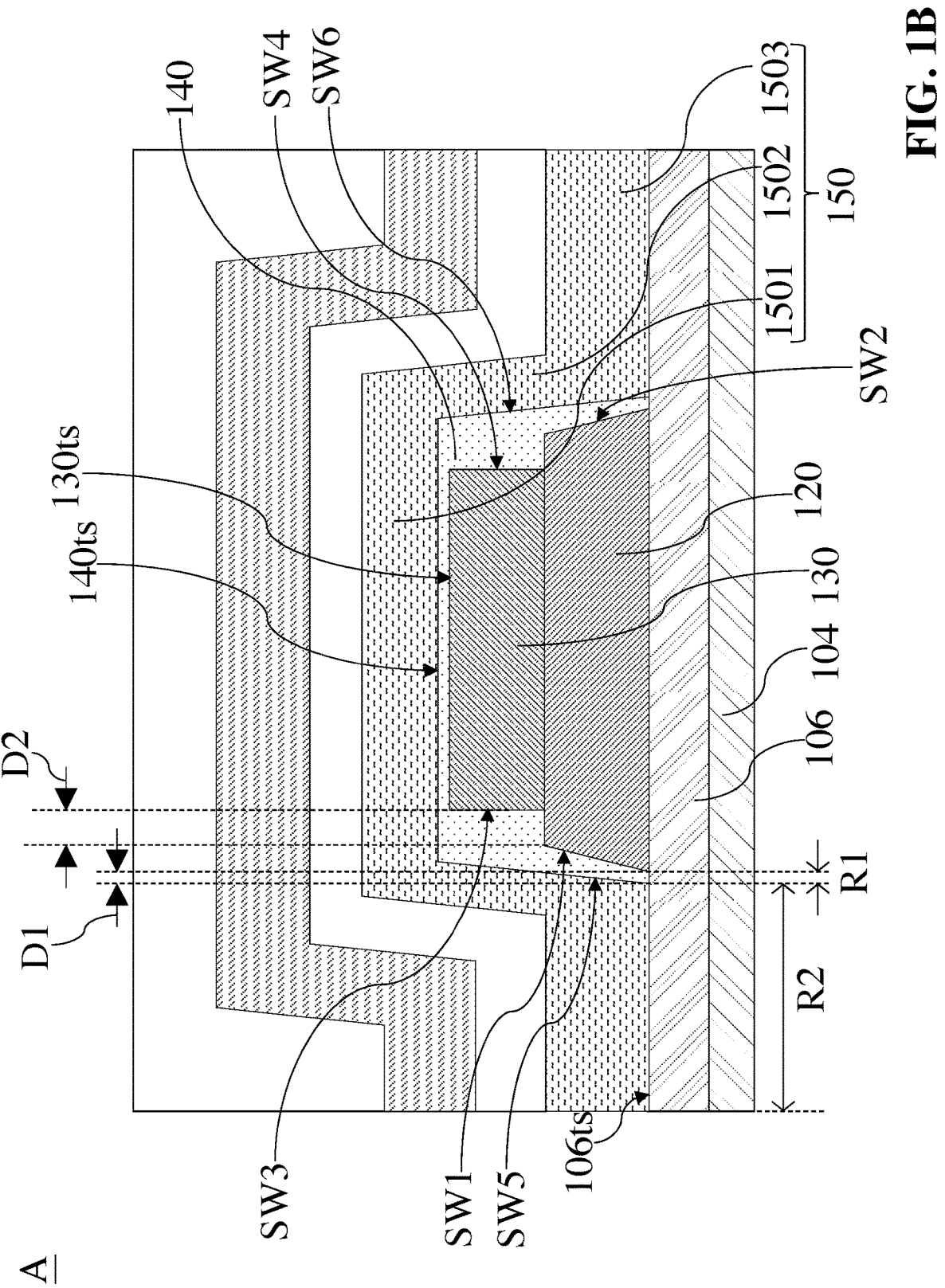
FIG. 1B is an enlarged vertical cross-sectional view of the region A in FIG. 1A according to some embodiments of the present disclosure.

FIG. 1A is a vertical cross-sectional view of a semiconductor device 100A according to some embodiments of the present disclosure. FIG. 1B is an enlarged vertical cross-sectional view of a region A in FIG. 1A according to some embodiments of the present disclosure. The semiconductor device 100A includes a substrate 102, a buffer layer 103, nitride-based semiconductor layers 104 and 106, source/drain (S/D) electrodes 110 and 112, a doped III-V semiconductor layer 120, a gate electrode 130, a gate protection layer 140, passivation layers 150, 160, 170, 172 and 174, a field plate 162, a patterned conductive layer 180, and a plurality of contact vias 190 and 192.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 103 can be disposed between the substrate 102 and the nitride-based semiconductor layer 104. The buffer layer 103 can be configured to reduce lattice and thermal mismatches between the substrate 102 and the nitride-based semiconductor layer 104, thereby curing defects due to the mismatches/difference. The buffer layer 103 may include a III-V compound. The III-V compound can include, for example but are not limited to, aluminum, gallium, indium, nitrogen, or combinations thereof. Accordingly, the exemplary materials of the buffer layer 103 can further include, for example but are not limited to, GaN, AlN, AlGaN, InAlGaN, or combinations thereof. In some embodiments, the semiconductor device 100A may further include a nucleation layer (not shown). The nucleation layer may be formed between the substrate 102 and the buffer layer 103. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The nitride-based semiconductor layer 104 is disposed over the substrate 102 and the buffer layer 103. The nitride-based semiconductor layer 106 is disposed on the nitride-based semiconductor layer 104. The exemplary materials of the nitride-based semiconductor layer 104 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$. The exemplary materials of the nitride-based semiconductor layer 106 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 100A is available to include at least one GaN-based high-electron-mobility transistor (HEMT).

The S/D electrodes 110 and 112 are disposed on the nitride-based semiconductor layer 106. The S/D electrodes 110 and 112 are in contact with the nitride-based semiconductor layer 106. The "S/D" electrode means each of the S/D electrodes 110 and 112 can serve as a source electrode or a drain electrode, depending on the device design. In some embodiments, the S/D electrodes 110 and 112 can include, for example but are not limited to, metals, alloys, doped semiconductor materials (such as doped crystalline silicon), compounds such as silicides and nitrides, other conductor materials, or combinations thereof. The exemplary materials of the S/D electrodes 110 and 112 can include, for example but are not limited to, Ti, AlSi, TiN, or combinations thereof. The S/D electrodes 110 and 112 may be a single layer, or plural layers of the same or different composition. In some embodiments, the S/D electrodes 110 and 112 form ohmic contact with the nitride-based semiconductor layer 106. The ohmic contact can be achieved by applying Ti, Al, or other suitable materials to the S/D electrodes 110 and 112. In some embodiments, each of the S/D electrodes 110 and 112 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The doped III-V semiconductor layer 120 is disposed on/above the nitride-based semiconductor layer 106. The gate electrode 130 is disposed on the doped III-V semiconductor layer 120. The doped III-V semiconductor layer 120 is disposed between the nitride-based semiconductor layer 106 and the gate electrode 130. The doped III-V semiconductor layer 120 and the gate electrode 130 are located between the S/D electrodes 110 and 112. That is, the S/D electrodes 110 and 112 can be located at two opposite sides of the gate electrode 130, respectively. In some embodiments, other configurations may be used, particularly when plural source, drain, or gate electrodes are employed in the device. In the exemplary illustration of FIG. 1A, the S/D electrodes 110 and 112 are symmetrical about the gate electrode 130. In other embodiments, the S/D electrodes 110 and 112 are asymmetrical about the gate electrode 130. For example, the S/D electrode 110 can be closer to the gate electrode 130 than the S/D electrode 112.

In the exemplary illustration of FIG. 1B, the semiconductor device 100A is an enhancement mode device, which is in a normally-off state when the gate electrode 130 is at approximately zero bias. Specifically, the doped III-V semiconductor layer 120 may create at least one p-n junction with the nitride-based semiconductor layer 106 to deplete the 2DEG region, such that at least one zone of the 2DEG region corresponding to a position below the corresponding the gate electrode 130 has different characteristics (e.g., different electron concentrations) than the rest of the 2DEG region and thus is blocked. Due to such mechanism, the semiconductor device 100A has a normally-off characteristic. In other words, when no voltage is applied to the gate electrode 130 or a voltage applied to the gate electrode 130 is less than a threshold voltage (i.e., a minimum voltage required to form an inversion layer below the gate electrode 130), the zone of the 2DEG region below the gate electrode 130 is kept blocked, and thus no current flows therethrough.

In some embodiments, the doped III-V semiconductor layer 120 can be omitted, such that the semiconductor device 100A is a depletion-mode device, which means the semiconductor device 100A in a normally-on state at zero gate-source voltage.

A profile of the doped III-V semiconductor layer 120 is, for example, a trapezoid profile, but the disclosure is not limited thereto. The doped III-V semiconductor layer 120 can be a p-type doped III-V semiconductor layer. The exemplary materials of the doped III-V semiconductor layer 120 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg. In some embodiments, the nitride-based semiconductor layer 104 includes undoped GaN and the nitride-based semiconductor layer 106 includes AlGaN, and the doped III-V semiconductor layer 120 is a p-type GaN layer which can bend the underlying band structure upwards and to deplete the corresponding zone of the 2DEG region, so as to place the semiconductor device 100A into an off-state condition.

The exemplary materials of the gate electrode 130 may include metals or metal compounds. The gate electrode 130 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The gate protection layer 140 is disposed on the nitride-based semiconductor layer 106. The gate protection layer 140 caps/covers the gate electrode 130 and the doped III-V semiconductor layer 120. More specifically, the doped III-V semiconductor layer 120 has a pair of opposite sidewalls SW1 and SW2, and the gate electrode 130 has a pair of opposite sidewalls SW3 and SW4. The sidewall SW3 is adjacent to the sidewall SW1. The sidewall SW4 is adjacent to the sidewall SW2. The sidewalls SW1 and SW2 of the doped III-V semiconductor layer 120 are entirely covered by the gate protection layer 140. The sidewalls SW3 and SW4 are entirely covered by the gate protection layer 140. The gate protection layer 140 at least extends from the sidewall SW1 to the sidewall SW2 of the doped III-V semiconductor layer 120 with covering a top surface 130ts of the gate electrode 130. The gate protection layer 140 is spaced apart from the S/D electrodes 110 and 112. A profile of the gate protection layer 140 is, for example, a rectangular profile, but the disclosure is not limited thereto. In some embodiments, the material of the gate protection layer 140 can include, for example but are not limited to, oxide dielectric material, such as silicon oxide ($SiO_x$), silicon oxynitride (SiON), or combinations thereof. In some embodiments, the material of the gate protection layer 140 can include, for example but are not limited to, plasma-enhanced oxide (PEOX), tetraethoxysilane normal abbreviation (TEOS), borophosphosilicate glass (BPSG), undoped silicon glass (USG), fluorinated silicate glass (FSG), low-pressure chemical vapor deposition silicon nitride (LPSiN), plasma enhanced chemical vapor deposition silicon nitride (PESIN), or combinations thereof.

The gate protection layer 140 can be formed to have outer sidewalls close to the doped III-V semiconductor layer 120 and the gate electrode 130. For example, the gate protection layer 140 has a pair of opposite sidewalls SW5 and SW6. The sidewall SW5 is adjacent to the sidewalls SW1 and SW3. The sidewall SW6 is adjacent to the sidewalls SW2 and SW4. Furthermore, from a vertical cross-sectional view of the semiconductor device 100A, a distance D1 from a bottom of the sidewall SW1 to a bottom of the sidewall SW5 can be less than a distance D2 from a bottom of the sidewall SW3 to a top of the sidewall SW1. Explained in another way, the gate electrode 130 can have an edge separated from an edge of the doped III-V semiconductor layer 120 by the distance D2. The gate protection layer 140 can have an edge separated from an edge of the doped III-V semiconductor layer 120 by the distance D1. In some embodiments, the distance D1 can be substantially equal to the distance D2. In some embodiments, the distance D1 can be greater than the distance D2. The disclosure is not limited thereto. In order to comply with different electrical characteristic requirements, the relationship between the distances D1 and D2 can be varied.

The passivation layer 150 covers the nitride-based semiconductor layer 106 and the gate protection layer 140. The passivation layer 150 abuts against the sidewalls of the S/D electrodes 110 and 112. The passivation layer 150 surrounds the gate protection layer 140 such that the S/D electrodes 110 and 112 and the gate protection layer 140 are separated from each other by the passivation layer 150. As such, the doped III-V semiconductor layer 120 can be entirely separated from the passivation layer 150 by the gate protection layer 140. Similarly, the gate electrode 130 can be entirely separated from the passivation layer 150 by the gate protection layer 140.

To be more specific, the passivation layer 150 further includes a top portion 1501, a side portion 1502 and a bottom portion 1503. The top portion 1501 is in contact with a top surface 140ts of the gate protection layer 140. The side portion 1502 is in contact with a sidewall SW5 (or SW6) of the gate protection layer 140 and extends obliquely from the top portion 1501 to the bottom portion 1503. The bottom portion 1503 is located between the gate protection layer 140 and the S/D electrode 110 (or 112). The bottom portion 1503 is in contact with the nitride-based semiconductor layer 106 and the S/D electrodes 110 and 112. In other words, the passivation layer 150 can have the bottom portion 1503 to abut against the sidewalls of the S/D electrodes 110 and 112. In addition, the S/D electrodes 110 and 112 can extend into via holes of the passivation layer 150 so as to make contact with the nitride-based semiconductor layer 106.

The passivation layer 150 can be formed for a protection purpose or for enhancing the electrical properties of the device (e.g., by providing an electrically isolation effect between/among different layers/elements). The exemplary materials of the passivation layers 150 can include, for example but are not limited to, SiN$_x$, SiO$_x$, Si$_3$N$_4$, SiON, SiC, SiBN, SiCBN, oxides, nitrides, plasma-enhanced oxide (PEOX), or combinations thereof. In some embodiments, the passivation layer 150 can be a multi-layered structure, such as a composite dielectric layer of Al$_2$O$_3$/SiN, Al$_2$O$_3$/SiO$_2$, AlN/SiN, AlN/SiO$_2$, or combinations thereof. In some embodiments, the material of the gate protection layer 140 can include, for example but are not limited to, tetraethoxysilane normal abbreviation (TEOS), borophosphosilicate glass (BPSG), undoped silicon glass (USG), fluorinated silicate glass (FSG), low-pressure chemical vapor deposition silicon nitride (LPSiN), plasma enhanced chemical vapor deposition silicon nitride (PESIN), or combinations thereof.

In some embodiments, the passivation layer 150 can include at least one material excluded in the gate protection layer 140. For example, the passivation layer 150 can include nitrogen, and the gate protection layer 140 is devoid of nitrogen. In some embodiments, the material of the passivation layer 150 can include nitride-based dielectric layer, such as silicon nitride (SiN). In some embodiments, the material of the gate protection layer 140 can include oxide dielectric layer, such as silicon oxide (SiO$_2$).

The gate protection layer 140 is formed to alleviate some issues during the manufacturing process of the semiconductor device 100A. To clearly describe the positive effect of the gate protection layer 140, FIG. 2 is a part of a vertical cross-sectional view of a semiconductor device 10 according to a comparative embodiment. The semiconductor device 10 includes nitride-based semiconductor layers 12 and 14, a doped III-V semiconductor layer 16, a gate electrode 18 and a passivation layer 20. The passivation layer 20 directly covers (or is directly in contact with) the surfaces of the gate electrode 18 and the doped III-V semiconductor layer 16.

During manufacturing process of the semiconductor device 10, the formation of the passivation layer 20 on the gate electrode 18 is made for the purpose of protecting the gate electrode 18. However, because the thermal expansion coefficient of the gate electrode 18 is not identical to that of the passivation layer 20, the passivation layer 20 would produce thermal stress to the gate electrode 18 due to the subsequent heating process. The thermal stress would affect the stress distribution of the gate electrode 18 and further worsen the electrical characteristics thereof. Furthermore, the difference between the thermal expansion coefficients of the nitride-based semiconductor layer 14 and the passivation layer 20 would result in the passivation layer 20 peeling off the nitride-based semiconductor layer 14.

After the formation of the gate electrode 18 which involves a patterning process, some metal particles 22 would remain on the top surface 14ts of the nitride-based semiconductor layer 14, which results from the removal of the excess portion of the gate electrode 18 during the patterning process. For example, if the gate electrode 18 is a TiN layer, Ti particles or Ti ions might be left over on the top surface 14ts after the patterning process. Accordingly, before the formation of the passivation layer 20, a cleaning process would be performed on the top surface 14ts of the nitride-based semiconductor layer 14 using a cleaning solution, thereby removing the metal particles/ions. The cleaning process involves oxidizing the metal particles/ions, which means the cleaning ability thereof is positively related to the oxidizing power of the cleaning solution.

However, the gate electrode 18 is easily damaged by the cleaning solution. Accordingly, in order not to damage the gate electrode 18, the available cleaning solution applied to the semiconductor device 10A in the cleaning process needs to be considered, which means the selectivity of the cleaning solution is limited and thus the performance of the semiconductor device 10 will be affected correspondingly.

Referring to FIGS. 1A and 1B again, in the semiconductor devices 100A, the gate protection layer 140 provided between the passivation layer 150 and the gate electrode 130 can endure the stress from the passivation layer 150, which will be advantageous to redistribute the stress. In this regard, the redistribution of the stress can be achieved by balancing/counteracting the stress of the passivation layer 150. Some of the stress can be transmitted to the nitride-based semiconductor layer 106 rather than the gate electrode 130 through the gate protection layer 140, which reduces the stress to be applied to the gate electrode 130. In addition, the material of the passivation layer 150 can be selected as being different from that of the gate electrode 130. Such configuration can make the gate protection layer 140 serve to accommodate the difference between the thermal expansion coefficients of the gate electrode 130 and the passivation layer 150. Therefore, the material of the gate protection layer 130 can have an intrinsic stress selected to balance/counteract the stress of the passivation layer 150, and the gate protection layer 140 can serve as a stress buffer layer. Furthermore, compared the semiconductor device 100A with the semiconductor device 10A, the passivation layer 150 is formed to have a volume less than that of the passivation layer 20 due to the occupation of the gate protection layer 140. The thermal stress generated by the passivation layer 150 is positively related to the volume thereof, so reducing the volume can lead to a decrease in the thermal stress. As such, the influence of the thermal stress on the gate electrode 130 can be effectively reduced.

As afore-mentioned, a cleaning process is required for removing metal particles/ions remaining on a top surface 106ts of the nitride-based semiconductor layer 106. The cleaning process can be performed after the formation of the gate protection layer 140 so the gate protection layer 140 can provide the gate electrode 130 with protection. Since the gate protection layer 140 is formed to have the outer sidewalls close to the gate electrode 130, most of the metal particles/ions remaining on the top surface 106ts can be removed, eliminating the influence of the metal particles/ions with respect to the 2DEG region. In some embodiments, the gate protection layer 140 is formed by using oxide dielectric material (e.g., silicon oxide) and thus can have antioxidative ability. Therefore, the semiconductor device 100A can have good electrical properties (i.e., favorable sheet resistance Rs or gate current Ig) and reliability.

Herein, the phrase "almost of the metal element remained on the top surface 106ts can be removed" means some of the metal particles/ions still remain on the top surface 106ts after the cleaning process. More specifically, the top surface 106ts of the nitride-based semiconductor layer 106 can have a region R1 covered with the gate protection layer 140 and a region R2 covered with the passivation layer 150. The number per unit area of the metal element distributed on the second region R2 is less than the number per unit area of the metal element distributed on the first region R1. For example, if energy-dispersive X-ray spectroscopy (EDS) is performed on the device, at least one metal element could be found within the first region R1 but not be found within the second region R2, in which the metal element is used for the formation of the gate electrode 130. In practical view, although there are some metal particles/ions remained on the top surface 106ts, the trade-off will bring the positive gain eventually.

Referring to FIG. 1A, the passivation layer 160 is disposed conformally over the passivation layer 150 and abuts against the sidewalls of the S/D electrodes 110 and 112. The exemplary materials of the passivation layers 160 can include, for example but are not limited to, $SiN_x$, $SiO_x$, $Si_3N_4$, SiON, SiC, SiBN, SiCBN, oxides, nitrides, plasma-enhanced oxide (PEOX), or combinations thereof. In some embodiments, the passivation layer 150 can be a multi-layered structure, such as a composite dielectric layer of $Al_2O_3$/SiN, $Al_2O_3$/$SiO_2$, AlN/SiN, AlN/$SiO_2$, or combinations thereof.

The field plate 162 is disposed on the passivation layer 160. The field plate 162 is connected to the S/D electrode 110. The field plate 162 can extend from the S/D electrode 110 or 112 to a position immediately on the gate protection layer 140. In some operations, the electric field will reach maximum at a gate edge toward a drain, which leads to breakdown and current collapse. Accordingly, the field plate design is implemented to reduce the peak electric field at the gate edge, improving uniformity of electric field distribution and hence increasing breakdown voltage. The exemplary materials of the field plate 162 can include, for example but are not limited to, conductive materials, such as Ti, Ta, TiN, TaN, or combinations thereof. In some embodiments, other conductive materials such as Al, Cu doped Si, and alloys including these materials may also be used.

The passivation layers 170, 172 and 174 are stacked on the field plate 162. The passivation layer 170 can serve as a planarization layer which has a level top surface to support other layers/elements. In some embodiments, the passivation layer 170 can be formed as being thicker, and a planarization process, such as chemical mechanical polish (CMP) process, is performed on the passivation layer 170 to remove the excess portions, thereby forming a level top surface. The materials of the passivation layers 170, 172 and 174 can be similar to the passivation layer 160.

The contact vias 190 are disposed on the field plate 162 and in the passivation layer 170. The contact vias 190 extend longitudinally so as to be electrically connected to the S/D electrodes 110 and 112. The exemplary materials of the contact vias 190 can include, but are not limited to, conductive materials, for example, metal or alloys.

The patterned conductive layer 180 is disposed on the top surface of the passivation layer 170 and in the passivation layer 172. The patterned conductive layer 180 is in contact with the contact vias 190. The patterned conductive layer 180 may have metal lines, pads, traces, or combinations thereof, such that the patterned conductive layer 180 can form at least one circuit. The patterned conductive layer 180 may include a single film or multilayered film having Ag, Al, Cu, Mo, Ni, Ti, alloys thereof, oxides thereof, nitrides thereof, or combinations thereof.

The contact vias 190 are disposed in the passivation layer 174. The contact vias 190 can be electrically connected to the patterned conductive layer 180. The exemplary materials of the contact vias 190 can include, but are not limited to, conductive materials, for example, metal or alloys. An external electronic device/apparatus (not shown) can send electrical signals to the semiconductor device 100A through the contact vias 190 and 192 and the patterned conductive layer 180, and vice versa.

Different stages of a method for manufacturing the semiconductor device 100A are shown in FIG. 3A, FIG. 3B, FIG. 3C, and FIG. 3D, described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figures 3A, 3B:
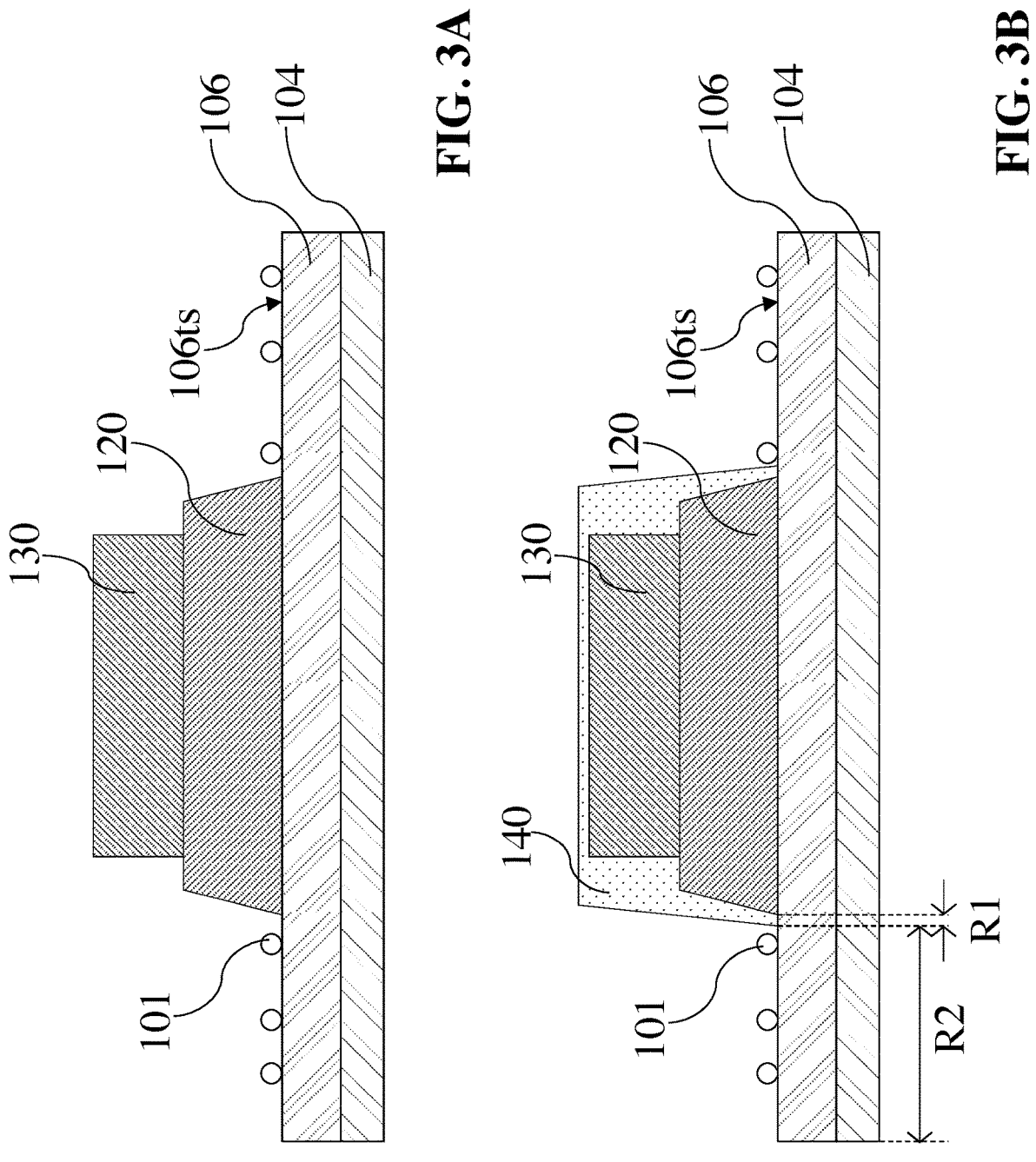
FIG. 3A, FIG. 3B, FIG. 3C, and FIG. 3D show different stages of a method for manufacturing a nitride-based semiconductor device according to some embodiments of the present disclosure.

Referring to FIG. 3A, nitride-based semiconductor layers 104, 106 and can be formed over a substrate in sequence by using deposition techniques. A doped III-V semiconductor layer 120 and a gate electrode 130 are formed over the nitride-based semiconductor layer 106. The formation of the doped III-V semiconductor layer 120 and the gate electrode 130 includes deposition techniques and a patterning process, wherein the deposition techniques can be performed for forming a blanket layer, and the patterning process can be performed for removing excess portions thereof. In some embodiments, the patterning process can include photolithography, exposure and development, etching, other suitable processes, or combinations thereof. During the etching process in the patterning process of the gate electrode 130, some metal particles/ions 101 may remain on a top surface 106ts of the nitride-based semiconductor layer 106. The element of the metal particles/ions 101 are related to the gate electrode 130. For example, as the gate electrode 130 is made of TiN, the metal particles/ions 101 are titanium particles or ions.

Referring to FIG. 3B, a blanket gate protection layer (not shown) can be formed over the nitride-based semiconductor layers 106 to cover the doped III-V semiconductor layer 120 and the gate electrode 130. Then, a patterning process is performed to remove the excess portions of the blanket gate protection layer. Accordingly, a gate protection layer 140 can be formed with covering the doped III-V semiconductor layer 120, the gate electrode 130, and a region R1 of the top surface 106ts of the nitride-based semiconductor layer 106. A region R2 of the top surface 106ts of the nitride-based semiconductor layer 106 is exposed from the gate protection layer 140. The region R2 of the top surface 106ts of the nitride-based semiconductor layer 106 is free from the coverage of the gate protection layer 140. The total area of the region R1 can be less than the total area of the region R2. In some embodiments, the deposition material of the gate protection layer 140 can include oxide dielectric material, such as silicon oxide ($SiO_x$).

Figures 3C, 3D:
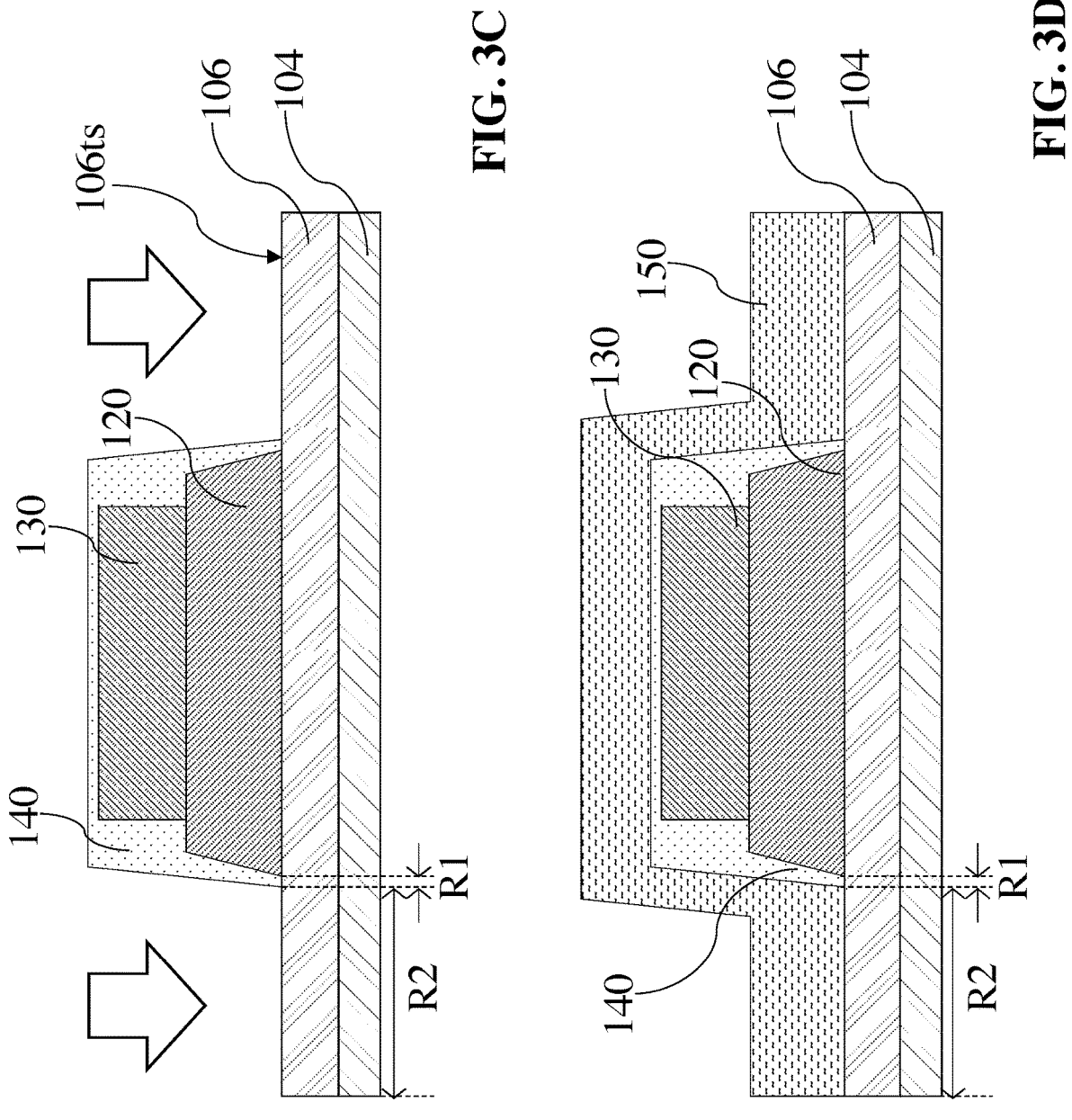

Referring to FIG. 3C, a cleaning process is performed on the region R2 of the top surface 106ts of the nitride-based semiconductor layer 106 using a standard cleaning solution. As such, the metal particles/ions 101 or other impurities accumulated at the region R2 of top surface 106ts of the nitride-based semiconductor layer 106 can be removed. In some embodiments, the standard clean solution can be a mixture of HCl, $H_2O_2$, and $H_2O$. In some embodiments, the standard cleaning solution can be a mixture of $NH_4OH$, $H_2O_2$, and $H_2O$. Since the material of the gate protection layer 140 is selected as the oxide dielectric material, the strong oxidant such as $H_2O_2$ in the standard clean solution is low activity with respect to the gate protection layer 140. The gate electrode 130 can be well protected by the gate protection layer 140 instead of being oxidized by the standard cleaning solution.

Referring to FIG. 3D, a passivation layer 150 is formed to cover the gate protection layer 140 and the region R2 of the top surface 106ts of the nitride-based semiconductor layer 106. In some embodiments, the deposition material of the passivation layer 150 can be nitride-based dielectric material different than the material of the gate protection layer 140. After the formation of the passivation layer 150, S/D electrodes 110 and 112, a field plate 162, passivation layers 160, 170, 172 and 174, a pattern conductive layer 180, and contact vias 190 and 192 can be formed, obtaining the configuration of the semiconductor device 100A as shown in FIG. 1A.

Figure 4:
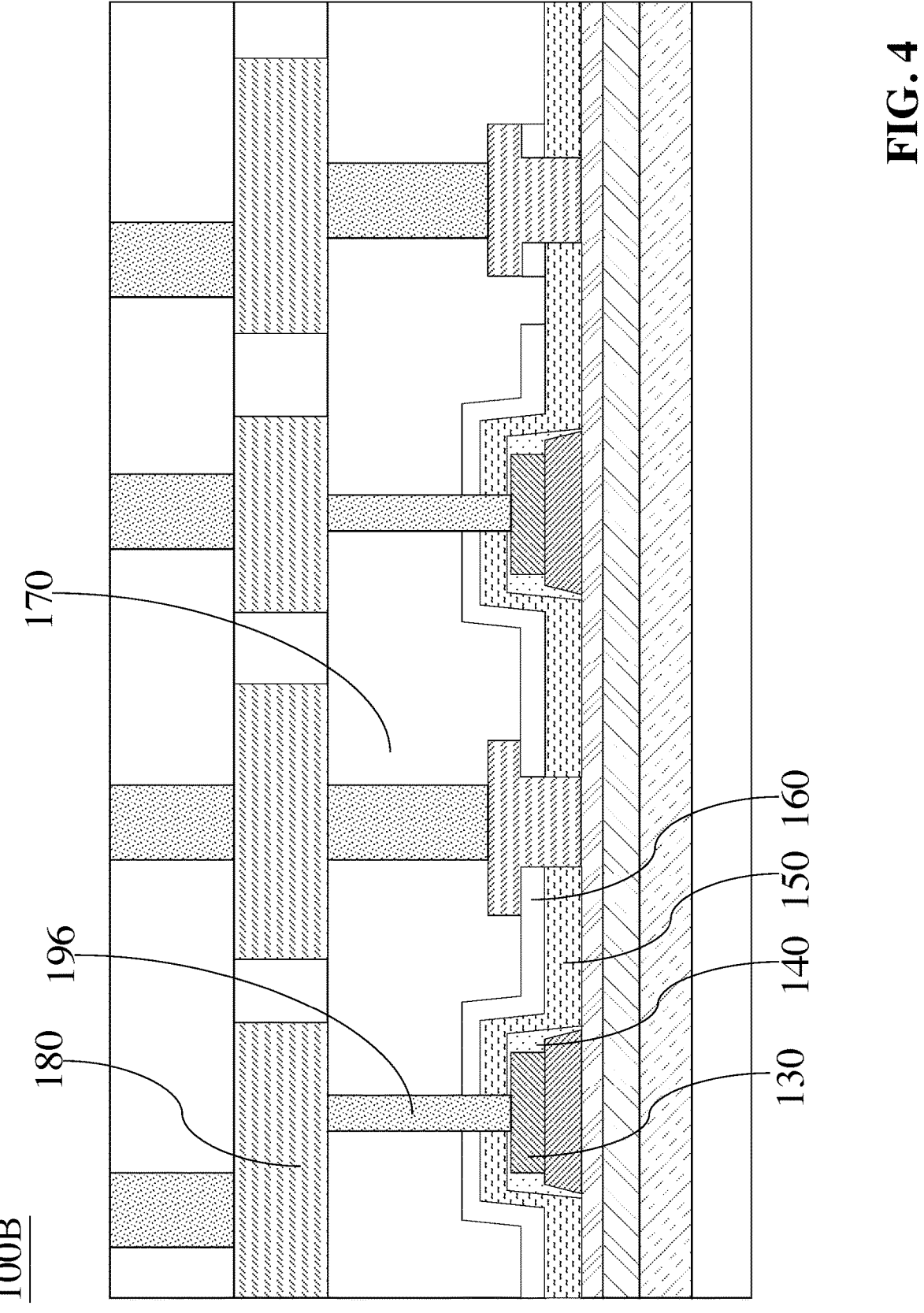
FIG. 4 is a vertical cross-sectional view of a nitride-based semiconductor device according to some embodiments of the present disclosure.

FIG. 4 is a cross-sectional view of a semiconductor device 100B according to some embodiments of the present disclosure. In the exemplary illustration of FIG. 4, the semiconductor device 100B further includes contact vias 196 penetrating the passivation layer 170, the gate protection layer 140, and the passivation layers 150 and 160. The contact vias 196 extending from the gate electrode 130 to the patterned conductive layer 180 for a purpose of electrical connection.

Figure 5:
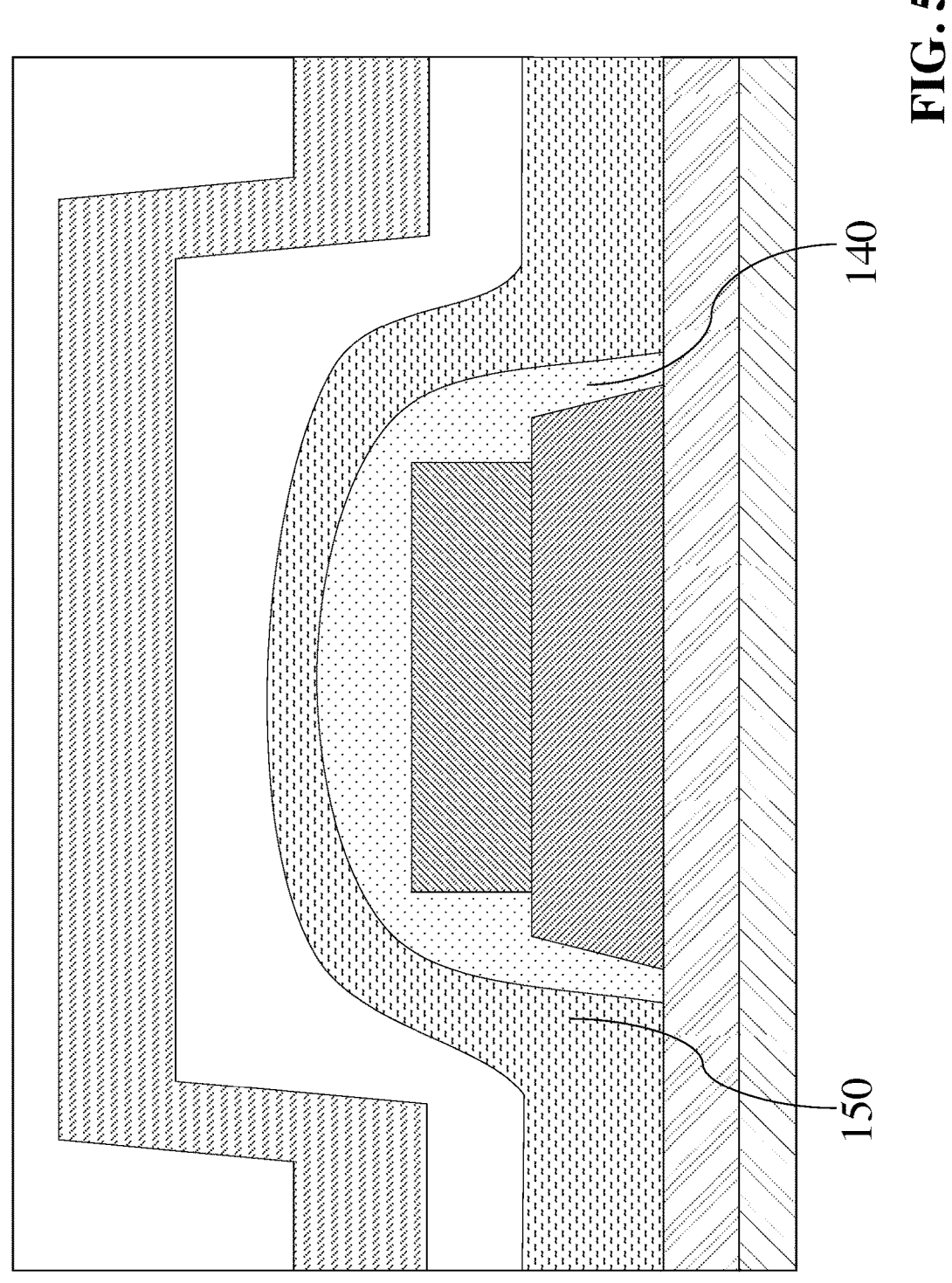
FIG. 5 is an enlarged vertical cross-sectional view of a nitride-based semiconductor device according to some embodiments of the present disclosure.

FIG. 5 is an enlarged vertical cross-sectional view of a nitride-based semiconductor device 100C according to some embodiments of the present disclosure. In the exemplary illustration of FIG. 5, the gate protection layer 140 has a curved outer sidewall. The curved outer sidewall can evenly distribute the stress from the passivation layer 150c. The passivation layer 150 has a bottom surface conformal with the gate protection layer 140 and thus an interface between the gate protection layer 140 and the passivation layer 150 is curved as well. The manufacturing method for manufacturing the semiconductor device 100C can be similar to the manufacturing method of the semiconductor device 100A. The profiles of the gate protection layer 140 and the passivation layer 150 can be controlled by tuning at least one parameter, such as temperature, to become curved.

It should be noted that the above semiconductor devices can be manufactured by the afore-mentioned different processes in order to meet different electrical requirements.

Based on above, in the present disclosure, the gate protection layer caps/covers the gate electrode and the doped III-V semiconductor layer and is located between the gate electrode and the passivation layer. The gate protection layer can release the thermal stress from the passivation layer to the gate electrode; furthermore, the material of the gate protection layer can be selected as the oxide dielectric material such that the gate protection layer can well protect the gate electrode. Hence, the cleaning solution with strong oxidizing power can be applied to the manufacturing process of the semiconductor devices. Accordingly, the semiconductor devices of the present disclosure can have good electrical properties and reliability.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to +4%, less than or equal to ±3%, less than or equal to ±2%, less than or equal to +1%, less than or equal to +0.5%, less than or equal to 0.1%, or less than or equal to 0.05%. The term "substantially coplanar" can refer to two surfaces within micrometers of lying along a same plane, such as within 40 m, within 30 m, within 20 m, within 10 m, or within 1 m of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
   a first nitride-based semiconductor layer;
   a second nitride-based semiconductor layer disposed on the first nitride-based semiconductor layer and having a bandgap greater than a bandgap of the first nitride-based semiconductor layer;
   two or more source/drain (S/D) electrodes disposed above the second nitride-based semiconductor layer;
   a gate electrode disposed above the second nitride-based semiconductor layer and between the S/D electrodes;
   a doped III-V semiconductor layer disposed between the second nitride-based semiconductor layer and the gate electrode;
   a gate protection layer capping the gate electrode and the doped III-V semiconductor layer and separated from the S/D electrodes; and
   a first passivation layer covering the second nitride-based semiconductor layer and the gate protection layer and abutting against sidewalls of the S/D electrodes which are separated from the gate protection layer by the first passivation layer, wherein at least one material of the gate protection layer has an intrinsic stress selected to redistribute a stress from the first passivation layer,
   wherein a top surface of the second nitride-based semiconductor layer has a first region in contact with the gate protection layer and a second region in contact with the first passivation layer, an orthographic projection of the gate electrode on the second nitride-based semiconductor layer is free from overlapping with each of the first region and the second region, the gate electrode comprises a metal element, and a number per unit area of the metal element distributed on the second region is less than a number per unit area of the metal element distributed on the first region.

2. The semiconductor device of claim 1, wherein the gate electrode comprises titanium nitride, and the metal element is titanium.

3. The semiconductor device of claim 1, wherein the doped III-V semiconductor layer is entirely separated from the first passivation layer by the gate protection layer.

4. The semiconductor device of claim 1, wherein the gate electrode is entirely separated from the first passivation layer by the gate protection layer.

5. The semiconductor device of claim 1, wherein the doped III-V semiconductor layer has a pair of opposite sidewalls, and the gate protection layer at least extends from one of the sidewalls of the doped III-V semiconductor layer to another one of the sidewalls of the doped III-V semiconductor layer.

6. The semiconductor device of claim 5, wherein the sidewalls of the doped III-V semiconductor layer are entirely covered by the gate protection layer.

7. The semiconductor device of claim 1, wherein the gate electrode has a pair of opposite sidewalls, and the gate protection layer at least extends from one of the sidewalls of the gate electrode to another one of the sidewalls of the gate electrode.

8. The semiconductor device of claim 7, wherein the gate electrode has a top surface between the sidewalls thereof, and the gate protection layer extends with covering the top surface of the gate electrode.

9. The semiconductor device of claim 7, wherein the sidewalls of gate electrode are entirely covered by the gate protection layer.

10. The semiconductor device of claim 1, wherein the gate protection layer comprises a first sidewall and a second sidewall that are opposite to each other, a distance from a sidewall of the doped III-V semiconductor layer facing one of the first sidewall and the second sidewall to the one of the first sidewall and the second sidewall is a first distance, a distance from a sidewall of the gate electrode facing the one of the first sidewall and the second sidewall to the one of the first sidewall and the second sidewall is a second distance, and the first distance is less than the second distance.

11. The semiconductor device of claim 10, wherein a horizontal distance between a bottom end of the sidewall of the gate electrode facing the second nitride-based semiconductor layer and a top end of the sidewall of the doped III-V semiconductor layer away from the second nitride-based semiconductor layer is a third distance, a horizontal distance between a bottom end of the sidewall of the doped III-V semiconductor layer facing the second nitride-based semiconductor layer and a bottom end of the one of the first sidewall and the second sidewall of the gate protection layer facing the second nitride-based semiconductor layer is a fourth distance, and the third distance is greater than the fourth distance.

12. The semiconductor device of claim 1, wherein the first passivation layer has a portion between the gate protection layer and the S/D electrode and in contact with the second nitride-based semiconductor layer.

13. The semiconductor device of claim 1, further comprising:
   a second passivation layer disposed on the first passivation layer; and
   a field plate disposed on the second passivation extending from one of S/D electrodes to a position immediately on the gate protection layer.

14. The semiconductor device of claim 1, wherein the gate protection layer is an oxide dielectric layer.

15. The semiconductor device of claim 1, wherein the first passivation layer is a nitride-based dielectric layer.

16. A method for manufacturing the semiconductor device of claim 1, comprising:
   forming the first nitride-based semiconductor layer disposed over a substrate;
   forming the second nitride-based semiconductor layer on the first nitride-based semiconductor layer;
   forming the gate electrode over the second nitride-based semiconductor layer by depositing the metal element and a group V element;
   forming the gate protection layer covering the gate electrode;
   cleaning the second region of the second nitride-based semiconductor layer which is free from the coverage of the gate protection layer using a standard cleaning solution; and
   forming a passivation layer covering the gate protection layer and the second region of the second nitride-based semiconductor layer.

17. The method of claim 16, further comprising:
   removing a portion of the passivation layer to form an opening exposing the second nitride-based semiconductor layer; and
   forming the source/drain (S/D) electrode in the opening of the second nitride-based semiconductor layer.

18. The method of claim 16, wherein the standard clean solution is a mixture of HCl, $H_2O_2$, and $H_2O$.

19. The method of claim 16, wherein cleaning the second region of the second nitride-based semiconductor layer is performed such that the metal element accumulated at a top surface of the second nitride-based semiconductor layer is removed.

20. The method of claim 19, the gate electrode comprises titanium nitride, and the metal element includes titanium.

\*   \*   \*   \*   \*